United States Patent
Chang et al.

(10) Patent No.: US 8,536,672 B2
(45) Date of Patent: Sep. 17, 2013

(54) IMAGE SENSOR PACKAGE AND FABRICATION METHOD THEREOF

(75) Inventors: Shu-Ming Chang, New Taipei (TW); Tien-Hao Huang, New Taipei (TW)

(73) Assignee: Xintec, Inc., Jhongli (TW)

( * ) Notice: Subject to any disclaimer, the term of this patent is extended or adjusted under 35 U.S.C. 154(b) by 371 days.

(21) Appl. No.: 13/050,949

(22) Filed: Mar. 18, 2011

(65) Prior Publication Data
US 2011/0227186 A1    Sep. 22, 2011

Related U.S. Application Data

(60) Provisional application No. 61/315,405, filed on Mar. 19, 2010.

(51) Int. Cl.
*H01L 23/48* (2006.01)
*H01L 31/02* (2006.01)

(52) U.S. Cl.
USPC .............. 257/434; 257/E23.011; 257/E31.11; 438/64

(58) Field of Classification Search
USPC ................... 257/433, 434, E23.011, E31.11; 438/64–67
See application file for complete search history.

(56) References Cited

U.S. PATENT DOCUMENTS
2006/0043569 A1*  3/2006  Benson et al. ................. 257/698

* cited by examiner

*Primary Examiner* — Julio J Maldonado
*Assistant Examiner* — Daniel Shook
(74) *Attorney, Agent, or Firm* — Liu & Liu

(57) ABSTRACT

An image sensor package includes an image sensor die having an active side and a backside, wherein an image sensor device region and a bond pad are provided on the active side. A through-silicon-via (TSV) structure extending through the thickness of the image sensor die is provided to electrically connect the bond pad. A multi-layer re-distributed interconnection structure is provided on the backside of the image sensor die. A solder mask or passivation layer covers the multi-layer re-distributed interconnection structure.

21 Claims, 11 Drawing Sheets

US 8,536,672 B2

IMAGE SENSOR PACKAGE AND FABRICATION METHOD THEREOF

CROSS REFERENCE TO RELATED APPLICATIONS

This application claims the priority from U.S. provisional application No. 61/315,405 filed Mar. 19, 2010.

BACKGROUND OF THE INVENTION

1. Field of the Invention

The present invention relates generally to optical device packaging. More particularly, the present invention relates to an image sensor package with multi-layer RDL, and fabrication method thereof.

2. Description of the Prior Art

In recent year, the solid state image sensor devices have been widely used in mobile phones, automotive and computer industries. However, the shrinkage of the pixel size of the image sensor device and the demand for higher pixel density may have adverse effect on the production yield. For example, the yield may be reduced due to physical contamination during assembly of the camera module. Therefore, packaged semiconductor die and the wafer-level packaging solution have gradually become the acceptable approach to increase yield.

However, one major challenge of the wafer level packaging is the design of the interconnection scheme. Typically, in the choices between top, side and bottom, the bottom contact may be the most popular way to assembly image sensor device because the active side of the image sensor die can operate in coordinate with the assembly direction of the camera modules. There is a growing need in high-density solder pad for high resolution image sensor devices and therefore the through silicon via (TSV) technology that is compatible with solder pad has gained much attention.

SUMMARY OF THE INVENTION

It is one objective of the present invention to provide a novel image sensor package that utilizes through silicon via (TSV) technology and has multi-layer redistribution circuit, and fabrication method thereof.

According to one preferred embodiment of the invention, an image sensor package comprises an image sensor die having an active side and a backside, wherein the active side includes an image sensor device region and a bond pad; a through silicon via (TSV) structure extending through thickness of the image sensor die to electrically connect the bond pad; a first insulating layer formed on the backside of the image sensor die and inside the TSV structure; a first redistribution layer formed on the first insulating layer and being electrically connected the bond pad; a second insulating layer covering the first redistribution layer and the first insulating layer; a second redistribution layer formed on the second insulating layer and being electrically connected to the first redistribution layer; and a solder mask layer covering the second redistribution layer and the second insulating layer.

From one aspect, in accordance with another preferred embodiment of the invention, an image sensor package comprises an image sensor die having an active side and a backside, wherein the active side includes an image sensor device region and a bond pad; a through silicon via (TSV) structure extending through thickness of the image sensor die to electrically connect the bond pad; and a multi-layer redistribution circuit structure on the backside of the image sensor die. A solder mask layer covers the multi-layer redistribution circuit structure. The solder mask layer includes at least one opening that exposes a portion of a solder pad, and wherein a solder ball is disposed on the solder pad. A plurality of dummy openings are provided in the solder mask layer to release stress exerted on the first or second insulating layer and act as crack stopper. The multi-layer redistribution circuit structure may comprise an electromagnetic interference (EMI) shielding pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention utilizes novel interconnecting technology to penetrate silicon layer to directly interconnect the bond pad of the image sensor die. The compact size and the arrangement of the interconnection allow the backside of the package to support high-density ball-grid array packaging interface, thereby facilitating subsequent assembly process to be compatible with surface mounting process. The present invention method is compatible with wafer-level packaging (WLP) and incorporates with through silicon via (TSV) technology. The wafer is then subjected to wafer dicing to form singulated packaged die.

Figure 1:
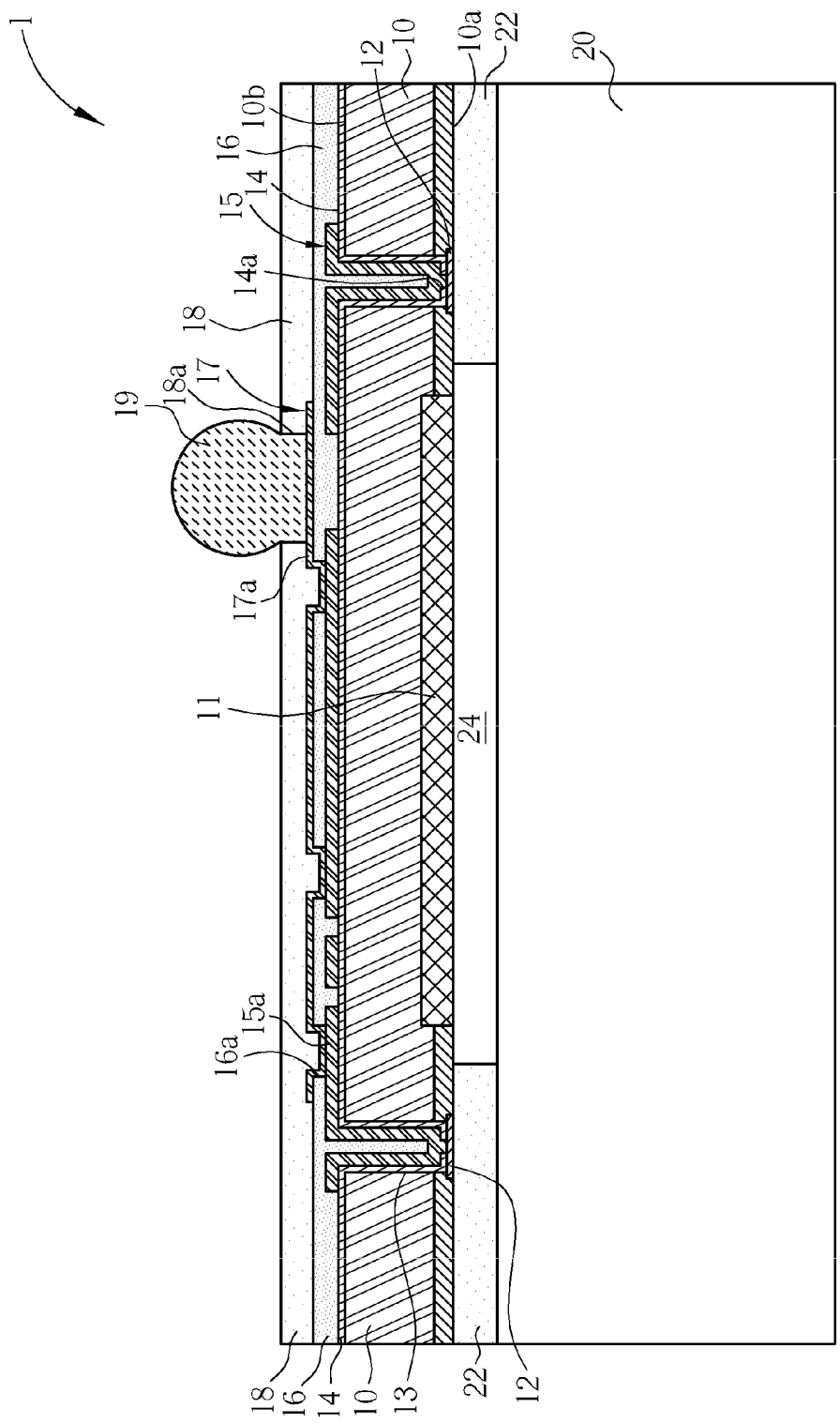
FIG. 1 is a schematic, cross-sectional diagram illustrating an image sensor package in accordance with one preferred embodiment of this invention.

FIG. 1 is a schematic, cross-sectional diagram illustrating an image sensor package in accordance with one preferred embodiment of this invention. As shown in FIG. 1, the image sensor package 1 comprises an image sensor die 10 having an active side 10a and a backside 10b opposite to the active side 10a. An image sensor device region 11 and a bond pad 12 are provided on the active side 10a of the image sensor die 10. The image sensor device region 11 may include, but not limited to, CMOS image sensor devices.

An optical lid 20 for the purpose of packaging is provided to cover the active side 10a of the image sensor die 10. For example, the optical lid 20 may be composed of optical-grade glass or quartz. A dam-like support structure 22 is disposed between the optical lid 20 and the active side 10a of the image sensor die 10. For example, the dam-like support structure 22 may be composed of epoxy resins, polyimide, photoresist or solder resist. A hermetical cavity structure 24 is confined between the optical lid 20, the dam-like support structure 22 and the active side 10a of the image sensor die 10. The aforesaid image sensor device region 11 is disposed within the cavity structure 24. In addition, the dam-like support structure 22 may be adhered to the active side 10a of the image sensor die 10 using adhesive material (not shown).

According to the preferred embodiment of this invention, the image sensor package 1 comprises a through silicon via (TSV) structure 13 that extends through the thickness of the image sensor die 10 to electrically connect the bond pad 12 on the active side 10a of the image sensor die 10. The TSV structure 13 communicates the active side 10a and the backside 10b of the image sensor die 10. During the fabrication of the image sensor package 1, a portion of the inner side of the bond pad 12 may be exposed within the TSV structure 13. A first insulating layer 14 is conformally formed on the sidewall of the TSV structure 13 and on the backside 10b of the image sensor die 10. For example, the first insulating layer 14 may include, but not limited to, silicon oxide, silicon nitride or silicon oxynitride. It is understood that the first insulating layer 14 may be composed of organic polymeric materials.

A first redistribution layer 15 is provided on the first insulating layer 14. For example, the first redistribution layer 15 may be aluminum circuit trace pattern or copper circuit trace pattern. The first redistribution layer 15 conformally covers the sidewall and the bottom of the TSV structure 13 and electrically connects the bond pad 12. The first redistribution layer 15 further comprises at least one connection pad 15a. A second insulating layer 16 such as silicon oxide, silicon nitride or silicon oxynitride is provided to cover the first redistribution layer 15 and the first insulating layer 14. It is understood that the second insulating layer 16 may be composed of organic polymeric materials. At least one opening 16a is provided in the second insulating layer 16 to expose a portion of the connection pad 15a.

A second redistribution layer 17 is formed on the second insulating layer 16. For example, the second redistribution layer 17 may be composed of titanium, copper, nickel, gold, aluminum or combinations thereof. The second redistribution layer 17 may be composed of soldable metal materials. The second redistribution layer 17 and the first redistribution layer 15 may be composed of the same conductive material. However, the second redistribution layer 17 and the first redistribution layer 15 may be composed of different conductive materials with different thicknesses. The second redistribution layer 17 fills the opening 16a and is electrically connected to the connection pad 15a. The second redistribution layer 17 comprises at least one solder pad 17a. A solder mask layer 18 is provided to cover the second redistribution layer 17 and the second insulating layer 16. For example, the solder mask layer 18 may be composed of epoxy resins, polyimide or photoresist. At least one opening 18a is provided in the solder mask layer 18. The opening 18a exposes a portion of the solder pad 17a. A solder ball 19 is disposed on the solder pad 17a.

Figure 2:
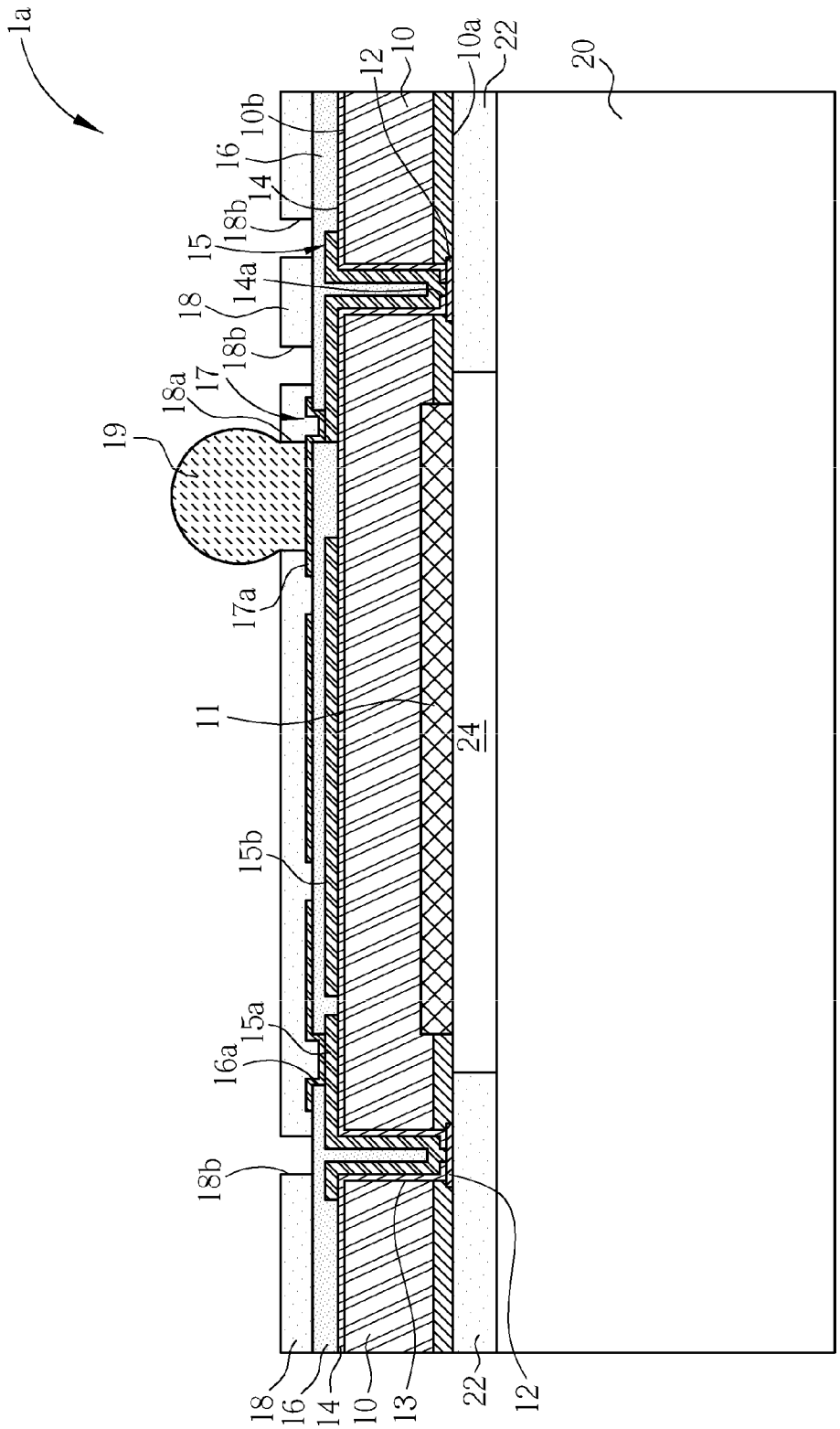
FIG. 2 is a schematic, cross-sectional diagram illustrating an image sensor package in accordance with another preferred embodiment of this invention.

FIG. 2 is a schematic, cross-sectional diagram illustrating an image sensor package in accordance with another preferred embodiment of this invention. As shown in FIG. 2, likewise, the image sensor package 1a comprises an image sensor die 10 having an active side 10a and a backside 10b opposite to the active side 10a. An image sensor device region 11 and a bond pad 12 are provided on the active side 10a of the image sensor die 10. The image sensor device region 11 may include, but not limited to, CMOS image sensor devices.

The image sensor package 1a comprises a TSV structure 13 that extends through the thickness of the image sensor die 10 to electrically connect the bond pad 12 on the active side 10a of the image sensor die 10. The TSV structure 13 communicates the active side 10a and the backside 10b of the image sensor die 10. During the fabrication of the image sensor package 1, a portion of the inner side of the bond pad 12 may be exposed within the TSV structure 13. A first insulating layer 14 is conformally formed on the sidewall of the TSV structure 13 and on the backside 10b of the image sensor die 10. For example, the first insulating layer 14 may include, but not limited to, silicon oxide, silicon nitride or silicon oxynitride. It is understood that the first insulating layer 14 may be composed of organic polymeric materials.

According to this preferred embodiment, a first redistribution layer 15 is provided on the first insulating layer 14. For example, the first redistribution layer 15 may be aluminum circuit trace pattern or copper circuit trace pattern. The first redistribution layer 15 conformally covers the sidewall and the bottom of the TSV structure 13 and electrically connects the bond pad 12. The first redistribution layer 15 further comprises at least one connection pad 15a and an EMI shielding pattern 15b. A second insulating layer 16 such as silicon oxide, silicon nitride or silicon oxynitride is provided to cover the first redistribution layer 15 and the first insulating layer 14. It is understood that the second insulating layer 16 may be composed of organic polymeric materials. At least one opening 16a is provided in the second insulating layer 16 to expose a portion of the connection pad 15a.

A second redistribution layer 17 is formed on the second insulating layer 16. For example, the second redistribution layer 17 may be composed of titanium, copper, nickel, gold, aluminum or combinations thereof. The second redistribution layer 17 may be composed of soldable metal materials. The second redistribution layer 17 fills the opening 16a and is electrically connected to the connection pad 15a. The second redistribution layer 17 comprises at least one solder pad 17a. A solder mask layer 18 is provided to cover the second redistribution layer 17 and the second insulating layer 16. For example, the solder mask layer 18 may be composed of epoxy resins, polyimide or photoresist. At least one opening 18a is provided in the solder mask layer 18. The opening 18a exposes a portion of the solder pad 17a. A solder ball 19 is disposed on the solder pad 17a. In addition, a plurality of dummy openings 18b are provided in the solder mask layer 18 for crack stopping. According to this preferred embodiment, the dummy openings 18b may be circular shaped, rectangular shaped, strip shaped, zigzag shaped or irregular shaped.

The differences between the image sensor package 1a in FIG. 2 and the image sensor package 1 in FIG. 1 include: (1) the image sensor package 1a in FIG. 2 has a unique EMI shielding pattern 15b for protecting image sensor die 10 from electromagnetic interference; and (2) the image sensor package 1a in FIG. 2 has a plurality of dummy openings 18b in the solder mask layer 18 for releasing the stress exerted in the insulating layer on the backside 10b of the image sensor die 10. The dummy openings 18b also function as a crack stopper.

Figure 3:
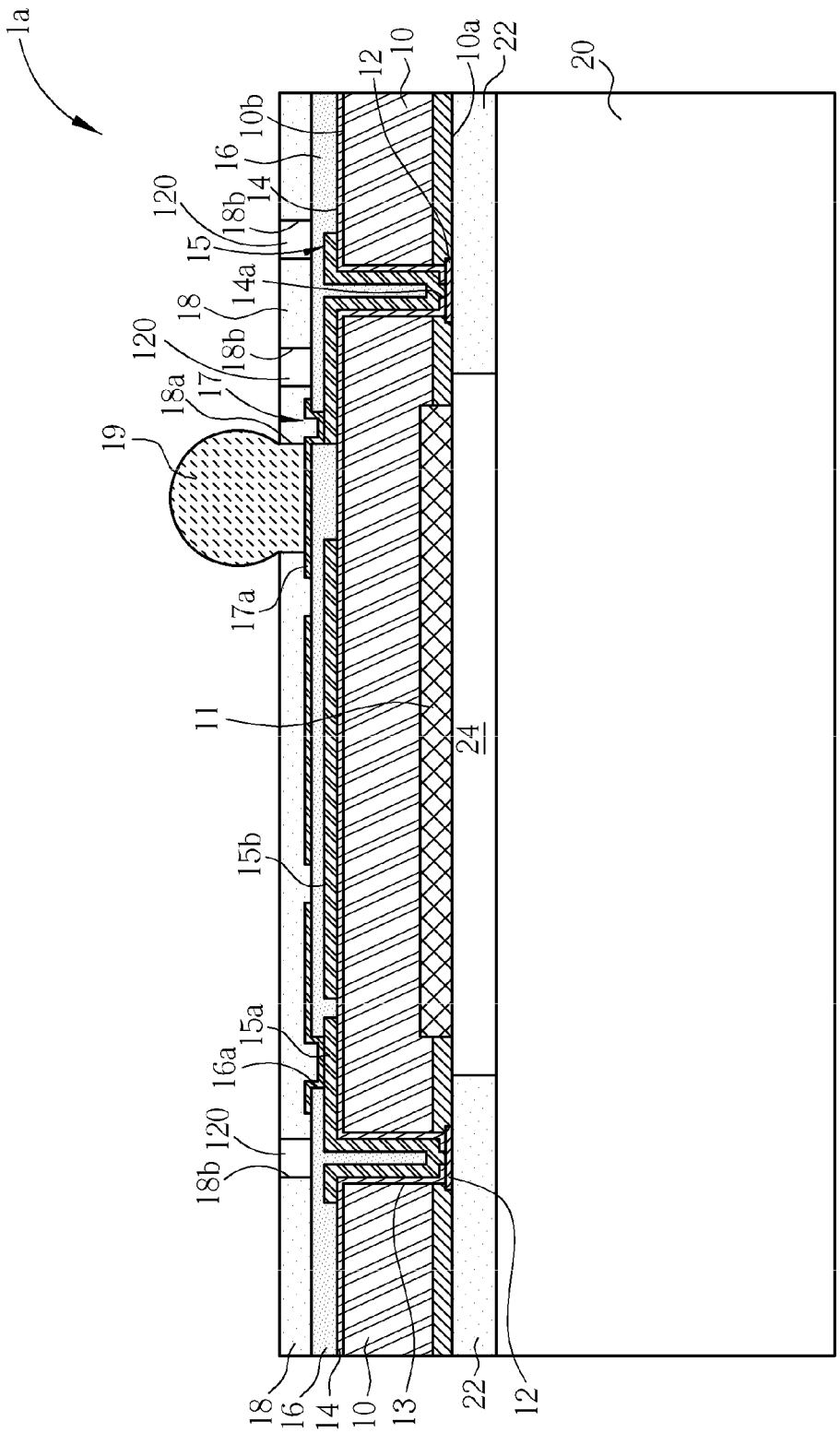
FIG. 3 is a schematic, cross-sectional diagram illustrating an image sensor package in accordance with still another preferred embodiment of this invention.

FIG. 3 is a schematic, cross-sectional diagram illustrating an image sensor package in accordance with still another preferred embodiment of this invention, wherein like numeral numbers designate like regions, layers or elements. As shown in FIG. 3, likewise, a solder mask layer 18 is provided to cover the second redistribution layer 17 and the second insulating layer 16. For example, the solder mask layer 18 may be composed of epoxy resins, polyimide or photoresist. At least one opening 18a is provided in the solder mask layer 18. The opening 18a exposes a portion of the solder pad 17a. A solder ball 19 is disposed on the solder pad 17a. In addition, a plurality of dummy openings 18b are provided in the solder mask layer 18 for crack stopping. According to this preferred embodiment, the dummy openings 18b may be filled with insulating material for releasing the stress exerted on the backside 10b of the image sensor die 10.

Figure 4:
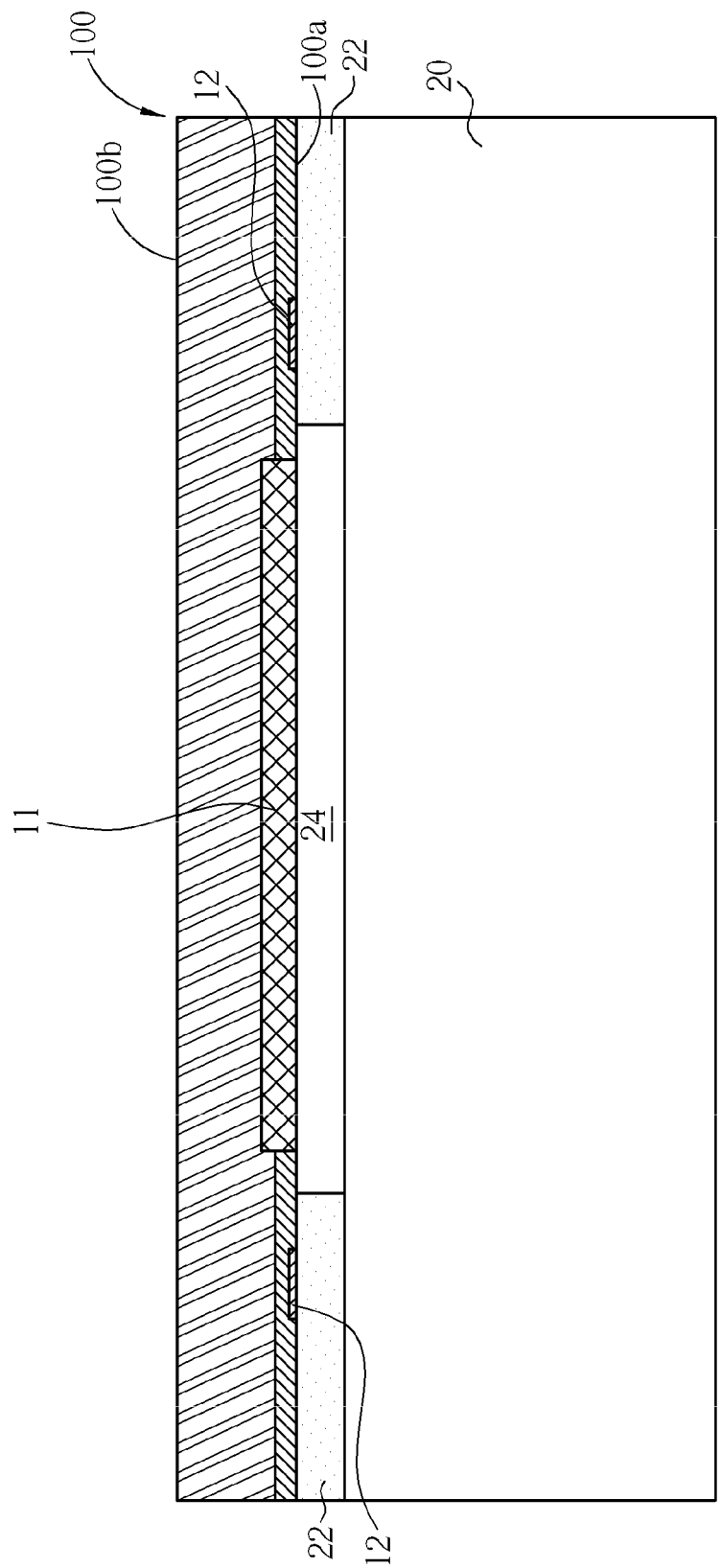
FIG. 4 to FIG. 11 are schematic, cross-sectional diagrams showing an exemplary method for fabricating the image sensor package 1 of FIG. 1 according to this invention.

FIG. 4 to FIG. 11 are schematic, cross-sectional diagrams showing an exemplary method for fabricating the image sensor package 1 of FIG. 1 in accordance with another embodiment of this invention, wherein like numeral numbers designate like regions, layers or elements. As shown in FIG. 4, an image sensor wafer 100 is provided. The image sensor wafer 100 has an active side 100a and a backside 100b opposite to the active side 100a. At least one image sensor device region 11 and a bond pad 12 are provided on the active side 100a. The image sensor device region 11 may include, but not limited to, CMOS image sensor device.

An optical lid 20 for the purpose of packaging is provided to cover the active side 100a of the image sensor wafer 100. For example, the optical lid 20 may be composed of optical-grade glass or quartz. A dam-like support structure 22 is disposed between the optical lid 20 and the active side 100a of the image sensor wafer 100. For example, the dam-like support structure 22 may be composed of epoxy resins, polyimide, photoresist or solder resist. A hermetical cavity structure 24 is confined between the optical lid 20, the dam-like support structure 22 and the active side 100a of the image sensor wafer 100. The aforesaid image sensor device region 11 is disposed within the cavity structure 24. In addition, the dam-like support structure 22 may be adhered to the active side 100a of the image sensor wafer 100 using adhesive material (not shown). Subsequently, the backside 100b of the image sensor wafer 100 is subjected to polishing process such as wafer backside grinding in order to remove a predetermined thickness of the image sensor wafer 100 from the backside 100b.

Figure 5:
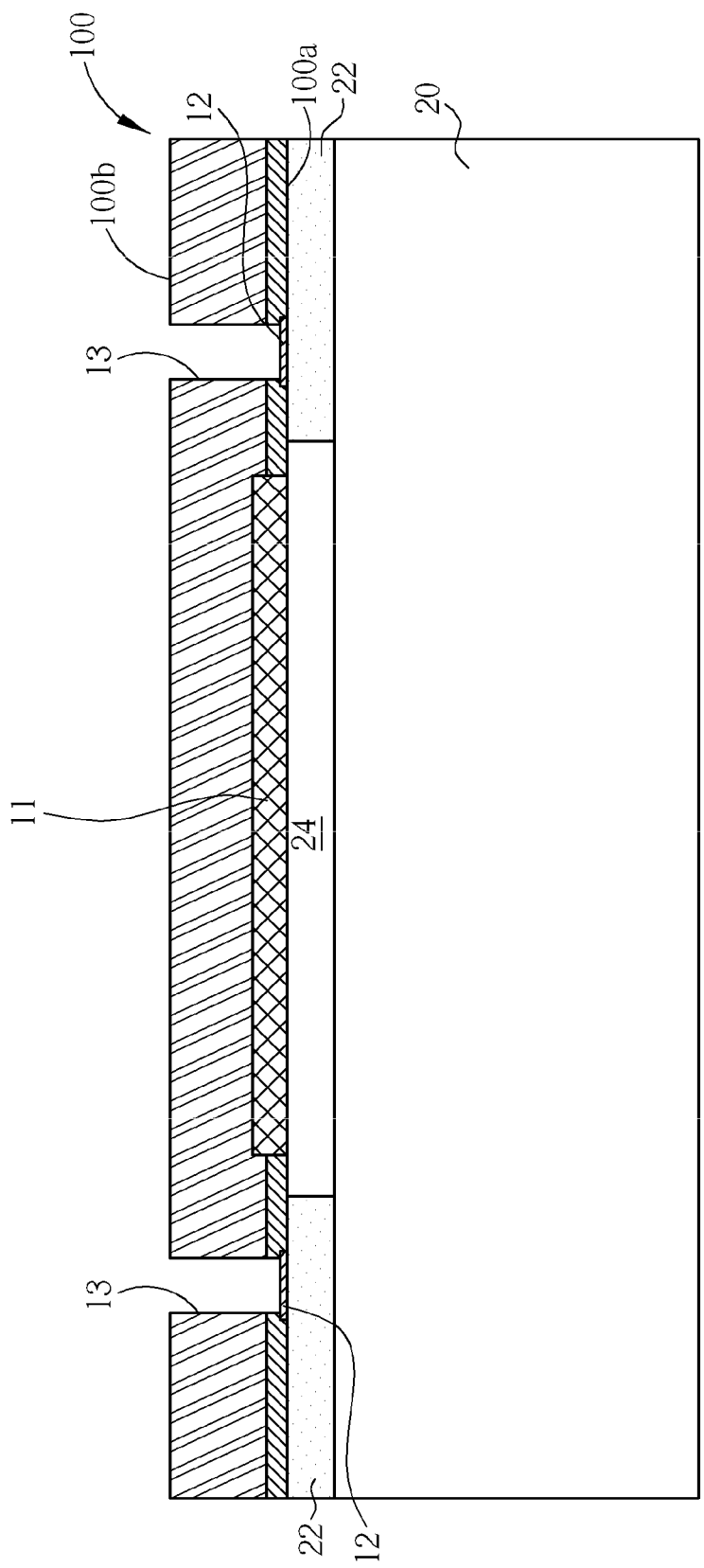

As shown in FIG. 5, after the wafer backside grinding process, a lithographic process and an etching process are carried out to etch a TSV structure 13 into the backside 100b of the image sensor wafer 100. The TSV structure 13 extends through the thickness of the image sensor wafer 100 and communicates the active side 10a and the backside 10b of the image sensor wafer 100. A portion of the inner side of the bond pad 12, which is formed on the active side 100a, may be exposed within the TSV structure 13.

Figure 6:
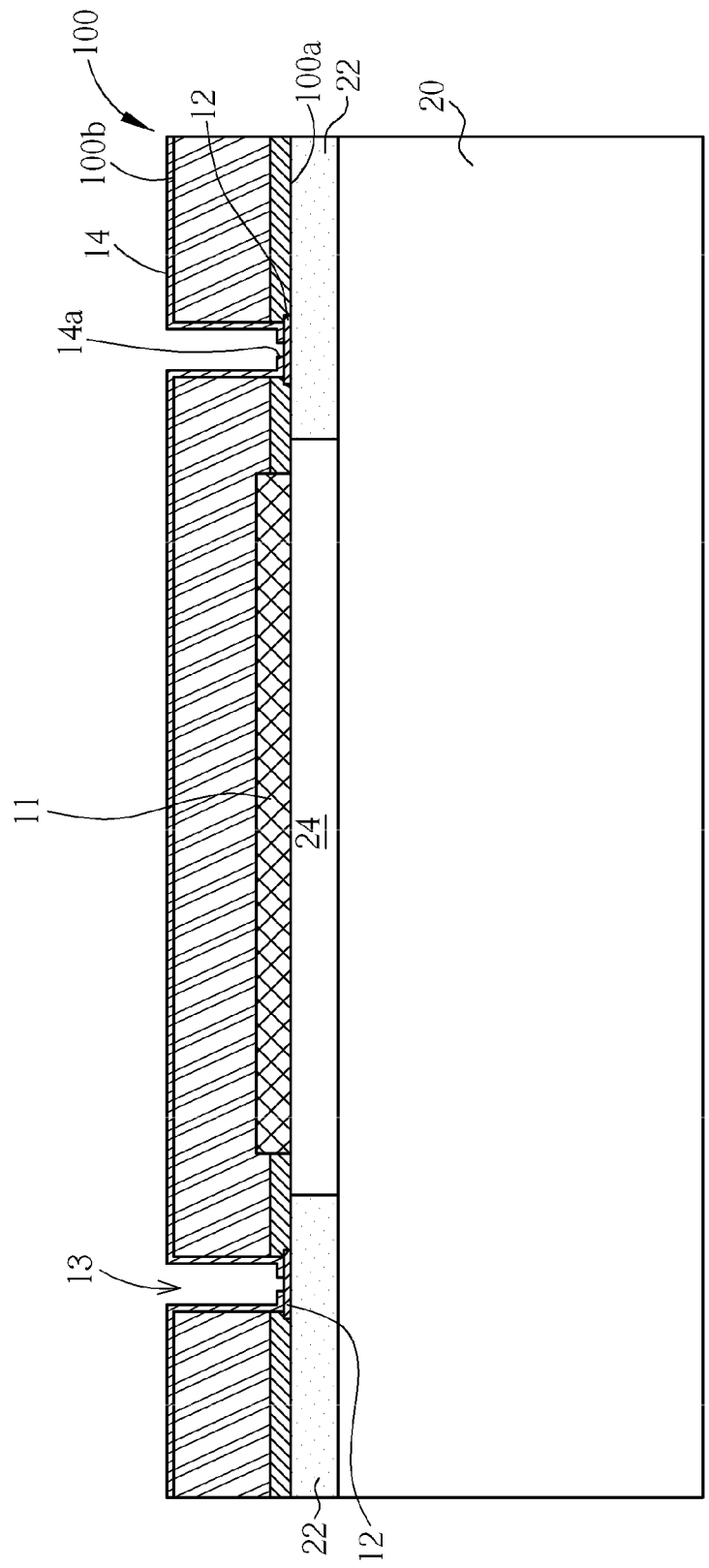

As shown in FIG. 6, a first insulating layer 14 is conformally formed on the sidewall of the TSV structure 13 and on the backside 100b of the image sensor wafer 100. For example, the first insulating layer 14 may include, but not limited to, silicon oxide, silicon nitride or silicon oxynitride. It is understood that the first insulating layer 14 may be composed of organic polymeric materials. Subsequently, a lithographic process and an etching process are carried out to etch a recessed opening 14a in the first insulating layer 14 at the bottom of the TSV structure 13. The opening 14a exposes a portion of the bond pad 12.

Figure 7:
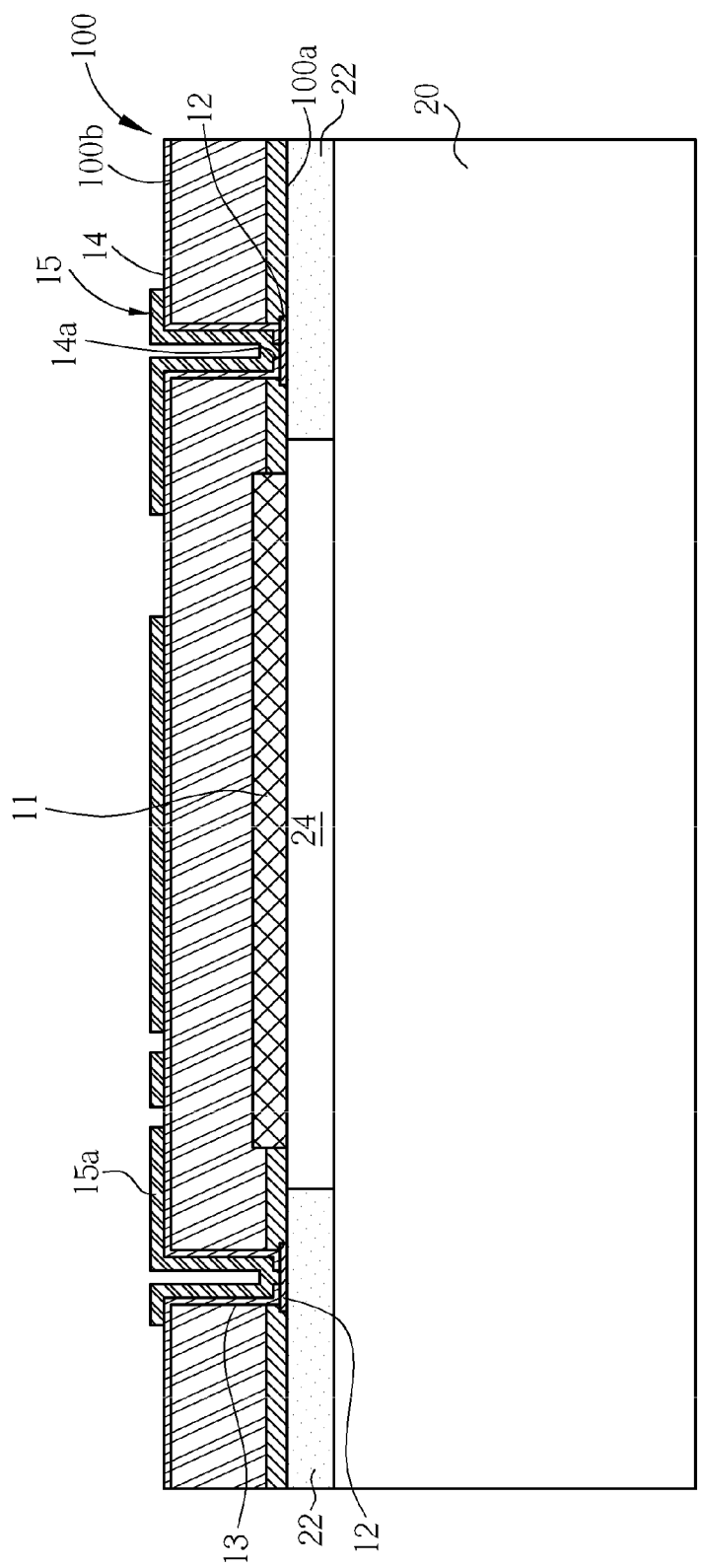

As shown in FIG. 7, a first redistribution layer 15 is formed on the first insulating layer 14. For example, the first redistribution layer 15 may be aluminum circuit trace pattern or copper circuit trace pattern. The first redistribution layer 15 conformally covers the sidewall and the bottom of the TSV structure 13 and electrically connects the bond pad 12. The first redistribution layer 15 further comprises at least one connection pad 15a.

Figure 8:
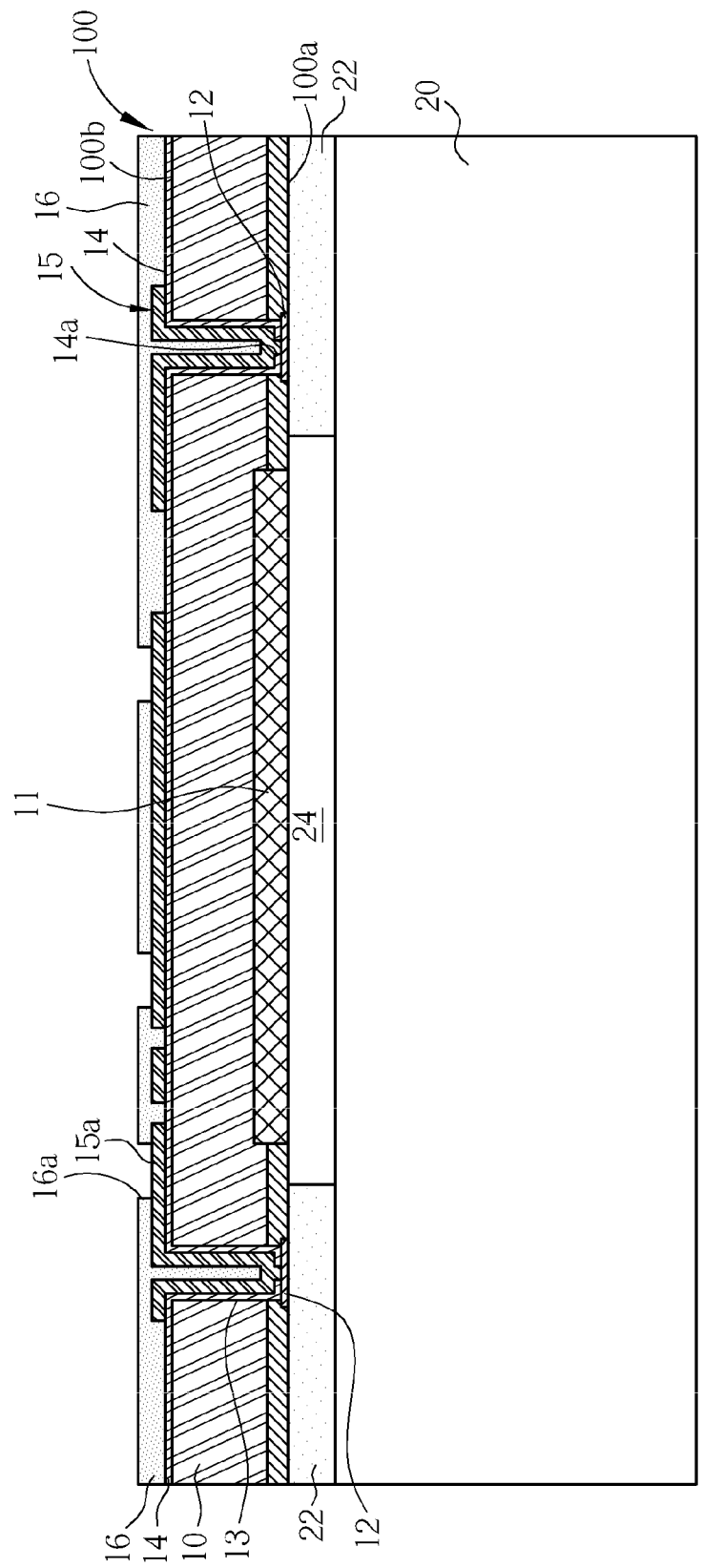

As shown in FIG. 8, a second insulating layer 16 such as silicon oxide, silicon nitride or silicon oxynitride is formed on the first redistribution layer 15 and the first insulating layer 14. It is understood that the second insulating layer 16 may be composed of organic polymeric materials. A lithographic process and an etching process are carried out to form at least one opening 16a in the second insulating layer 16. The opening 16a exposes a portion of the connection pad 15a.

Figure 9:
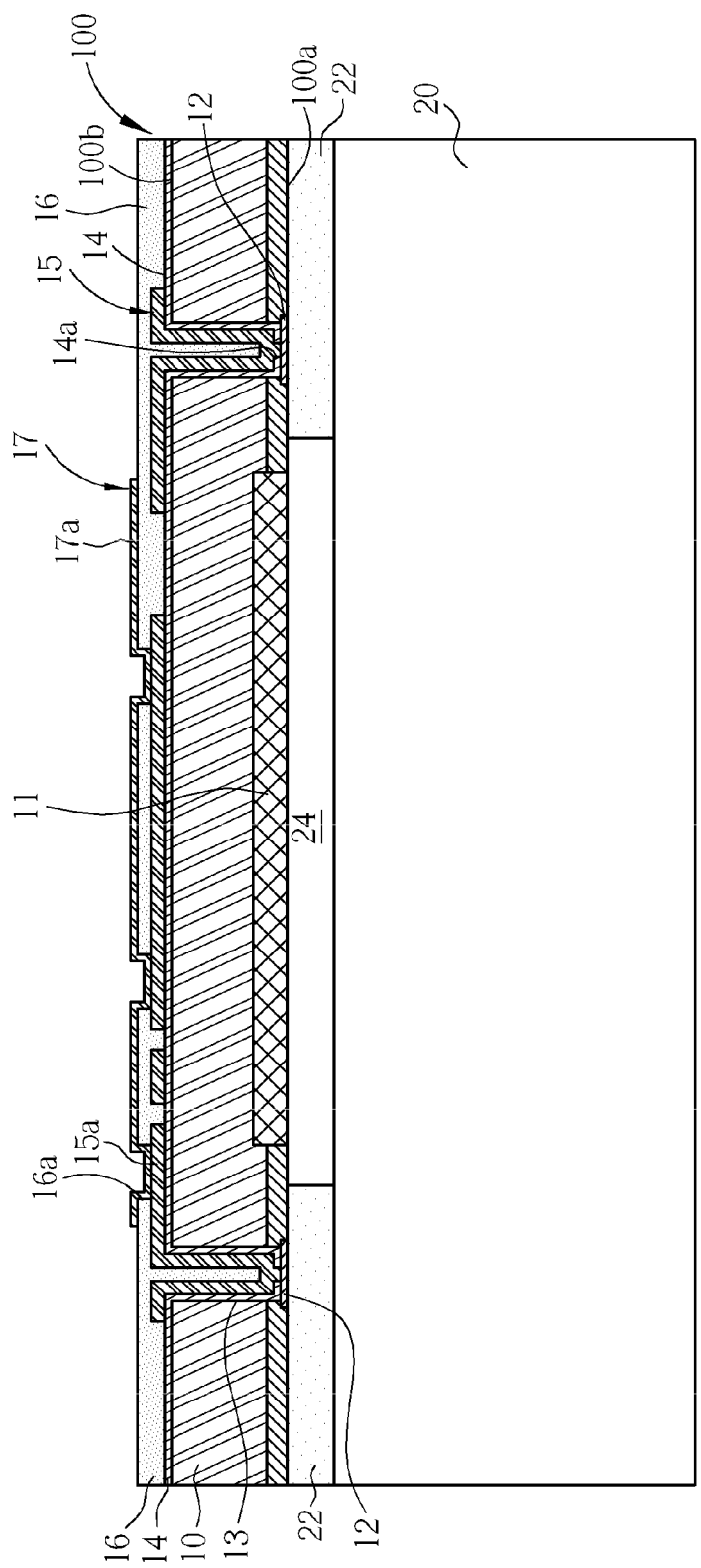

As shown in FIG. 9, subsequently, a second redistribution layer 17 is formed on the second insulating layer 16. For example, the second redistribution layer 17 may be composed of titanium, copper, nickel, gold, aluminum or combinations thereof. The second redistribution layer 17 may be composed of soldable metal materials. The second redistribution layer 17 and the first redistribution layer 15 may be composed of the same conductive material. However, the second redistribution layer 17 and the first redistribution layer 15 may be composed of different conductive materials with different thicknesses. The second redistribution layer 17 fills into the opening 16a and is electrically connected to the connection pad 15a. The second redistribution layer 17 comprises at least one solder pad 17a.

Figure 10:
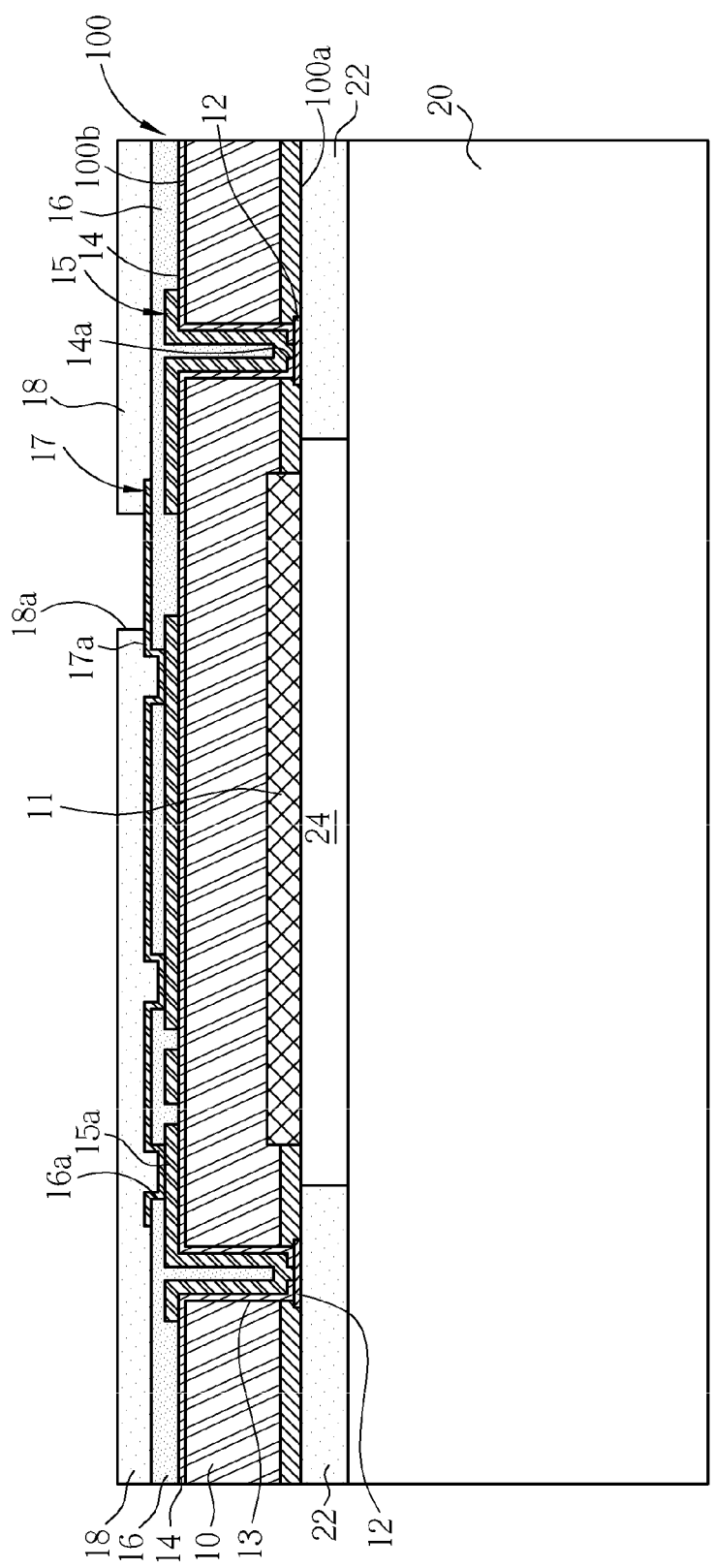
Figure 11:
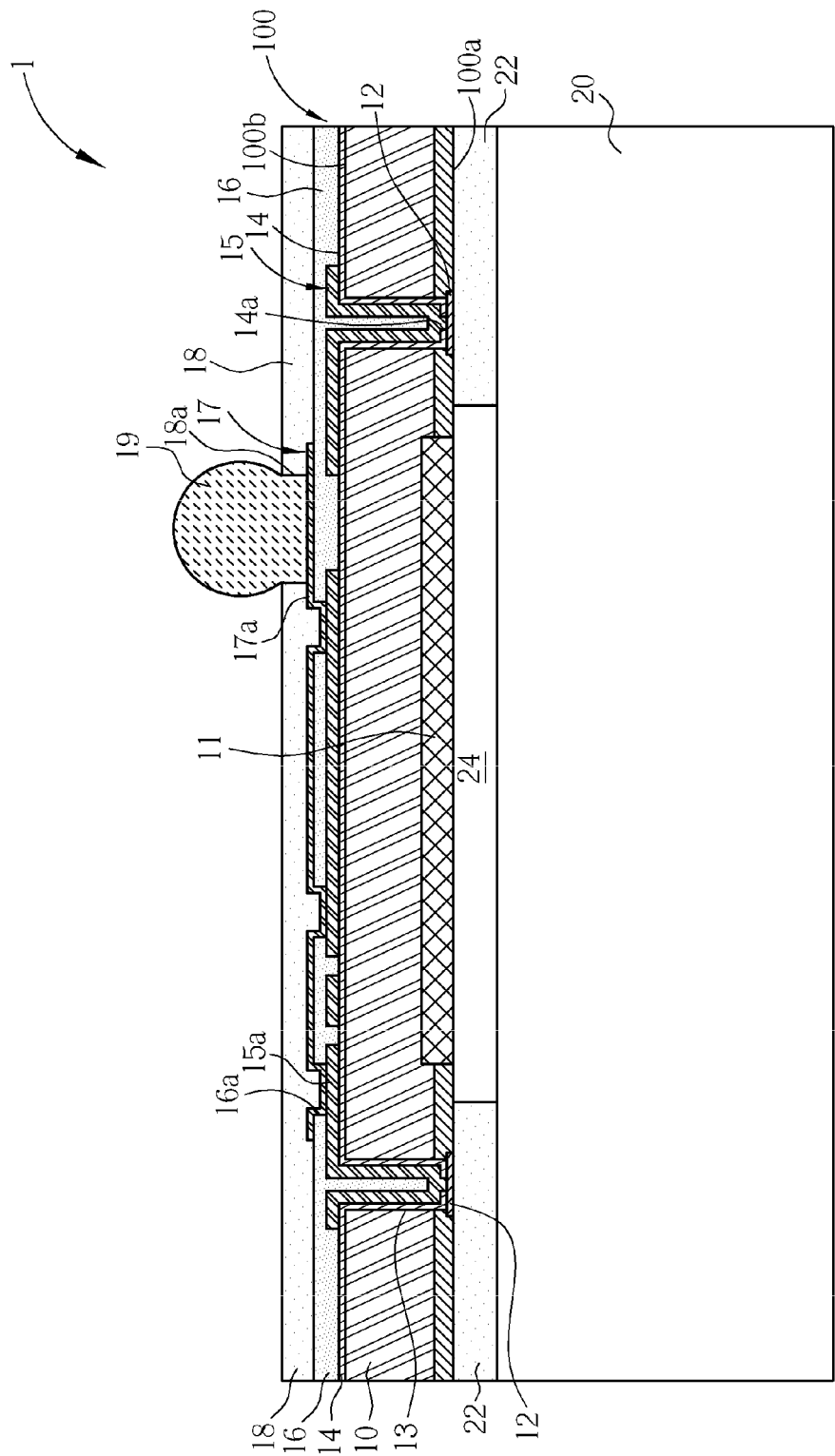

As shown in FIG. 10 and FIG. 11, a solder mask layer 18 is provided to cover the second redistribution layer 17 and the second insulating layer 16. For example, the solder mask layer 18 may be composed of epoxy resins, polyimide or photoresist. At least one opening 18a is then formed in the solder mask layer 18. The opening 18a exposes a portion of the solder pad 17a. Thereafter, a solder ball 19 is disposed on the solder pad 17a within the opening 18a. A wafer sawing or dicing process is performed to form singulated image sensor package 1 as depicted in FIG. 1. The embodiment as set forth through FIGS. 4-11 is described in sufficient detail to enable those skilled in the art to practice the invention. The present invention is not limited to two-layer redistribution circuit structure. Other embodiments such as multiple layer redistribution circuit structure may be utilized and structural, logical, and electrical changes may be made without departing from the scope of the present invention.

The present invention includes at least the following advantages or technical features: (1) the image sensor package is fabricated by wafer level packaging incorporated with through silicon via (TSV) technology, which features a multi-layer redistribution layer on the backside of the image sensor die to allow more input/output (I/O) pin count, more flexible circuit layout, and is much more cost effective; (2) an EMI shielding pattern may be formed in the first redistribution layer to protect the image sensor die from electromagnetic interference; and (3) dummy openings may be formed in the solder mask layer for releasing stress exerted on the insulating layer and may act as crack stopper.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor package, comprising:
   an image sensor die having an active side and a backside, wherein the active side includes an image sensor device region and a bond pad;
   a through silicon via (TSV) structure extending through thickness of the image sensor die to electrically connect the bond pad;
   a first insulating layer formed on the backside of the image sensor die and inside the TSV structure;
   a first redistribution layer formed on the first insulating layer and being electrically connected the bond pad;
   a second insulating layer covering the first redistribution layer and the first insulating layer;
   a second redistribution layer formed on the second insulating layer and being electrically connected to the first redistribution layer; and a solder mask layer covering the second redistribution layer and the second insulating layer.

2. The image sensor package according to claim 1 wherein the active side of the image sensor die is covered with an optical lid.

3. The image sensor package according to claim 2 wherein a dam-like support structure is disposed between the optical lid and the active side of the image sensor die.

4. The image sensor package according to claim 2 wherein the dam-like support structure is composed of epoxy resins, polyimide, photoresist or solder resist.

5. The image sensor package according to claim 1 wherein the solder mask layer includes at least one opening that exposes a portion of a solder pad, and wherein a solder ball is disposed on the solder pad.

6. The image sensor package according to claim 1 wherein a plurality of dummy openings are provided in the solder mask layer to release stress exerted on the first or second insulating layer and act as crack stopper.

7. The image sensor package according to claim 6 wherein an insulating material is filled into the plurality of dummy openings.

8. The image sensor package according to claim 1 wherein the first redistribution layer comprises a connection pad and an electromagnetic interference (EMI) shielding pattern.

9. An image sensor package, comprising:
    an image sensor die having an active side and a backside, wherein the active side includes an image sensor device region and a bond pad;
    a through silicon via (TSV) structure extending through thickness of the image sensor die to electrically connect the bond pad; and
    a multi-layer redistribution circuit structure on the backside of the image sensor die.

10. The image sensor package according to claim 9 wherein the active side of the image sensor die is covered with an optical lid.

11. The image sensor package according to claim 10 wherein a dam-like support structure is disposed between the optical lid and the active side of the image sensor die.

12. The image sensor package according to claim 9 wherein a solder mask layer covers the multi-layer redistribution circuit structure.

13. The image sensor package according to claim 12 wherein the solder mask layer includes at least one opening that exposes a portion of a solder pad, and wherein a solder ball is disposed on the solder pad.

14. The image sensor package according to claim 12 wherein a plurality of dummy openings are provided in the solder mask layer to release stress exerted on the first or second insulating layer and act as crack stopper.

15. The image sensor package according to claim 14 wherein an insulating material is filled into the plurality of dummy openings.

16. The image sensor package according to claim 9 wherein the multi-layer redistribution circuit structure comprises an electromagnetic interference (EMI) shielding pattern.

17. A method for fabricating an image sensor package, comprising:
    providing a wafer having at least an active side and at least a backside, wherein the active side comprises at least one image sensor device region and a bond pad;
    covering the active side of the wafer with an optical lid;
    etching at least one through silicon via (TSV) structure from the backside of the wafer, wherein the TSV) structure extends through thickness of the wafer to electrically connect the bond pad;
    depositing a first insulating layer on the backside of the wafer and on sidewall of the TSV structure;
    forming a recessed opening in the first insulating layer at a bottom of the TSV structure to expose a portion of the bond pad;
    forming a first redistribution layer on the first insulating layer, wherein the first redistribution layer is electrically connected to the bond pad;
    forming a second insulating layer on the first redistribution layer;
    forming a first opening in the second insulating layer to expose a portion of the first redistribution layer; and
    forming a second redistribution layer on the second insulating layer, wherein the second redistribution layer is electrically connected to the first redistribution layer through the first opening.

18. The method for fabricating an image sensor package according to claim 17 further comprising the following steps after forming the second redistribution layer:
    forming a solder mask layer on the second redistribution layer;
    forming at least one second opening on the solder mask layer to expose a portion of the second redistribution layer; and
    forming a solder ball in the second opening.

19. The method for fabricating an image sensor package according to claim 18 wherein the a plurality of dummy openings are provided in the solder mask layer concurrently with the formation of the second opening.

20. The method for fabricating an image sensor package according to claim 19 wherein the plurality of dummy openings are provided in the solder mask layer to release stress exerted on the first or second insulating layer.

21. The method for fabricating an image sensor package according to claim 19 wherein an insulating material is filled into the plurality of dummy openings.

* * * * *